United States Patent [19]
Kosugi

[11] 4,441,853
[45] Apr. 10, 1984

[54] DISC ORIENTING DEVICE

[75] Inventor: Masao Kosugi, Yokohama, Japan

[73] Assignee: Canon Kabushiki Kaisha, Tokyo, Japan

[21] Appl. No.: 487,414

[22] Filed: Apr. 28, 1983

Related U.S. Application Data

[63] Continuation of Ser. No. 204,004, Oct. 31, 1980, abandoned.

[30] Foreign Application Priority Data

Nov. 5, 1979 [JP] Japan ................................. 54-142937

[51] Int. Cl.³ ............................................. B65G 47/24
[52] U.S. Cl. ................................. 414/757; 198/394; 406/87
[58] Field of Search ................... 406/10, 87; 198/380, 198/394; 414/755, 757

[56] References Cited

U.S. PATENT DOCUMENTS 3,820,647  6/1974  Waugh, Jr. et al. ............ 414/757 X
3,865,254  2/1975  Johannsmeier ................. 198/394 X
3,982,627  9/1976  Isohata ............................ 406/87 X Primary Examiner—Jeffrey V. Nase
Attorney, Agent, or Firm—Fitzpatrick, Cella, Harper & Scinto

[57] ABSTRACT

A device for orienting a disc having a flat portion formed on the outer periphery thereof, for example, a wafer for the manufacture of a semiconductor circuit element. The disc is guided and rotated by a rotatable roller and a drive roller which point-contact the outer periphery of the disc. The rotation of the disc is stopped when the disc has come to a predetermined rotational position. By this, rough orientation of the disc is accomplished. Subsequently, the disc is urged toward the rotatable roller and the drive roller. At this time, the drive roller is disconnected from a drive source and becomes a low torque rotating roller. Accordingly, precise orientation is accomplished without hampering the rotation of the disc.

2 Claims, 8 Drawing Figures

DISC ORIENTING DEVICE

This application is a continuation of application Ser. No. 204,004 filed Oct. 31, 1980 now abandoned.

BACKGROUND OF THE INVENTION

1. Field of the Invention

This invention relates to a device for orienting a disc having a flat portion on the outer periphery thereof.

2. Description of the Prior Art

Various devices for orienting a disc having a flat portion formed on the outer periphery thereof, for example, a wafer for the manufacture of a semiconductor circuit element, have heretofore been proposed.

For example, U.S. Pat. No. 3,297,134 discloses a device for orienting a disc by urging the flat portion of the disc against a flat surface. U.S. Pat. No. 3,865,254 discloses a device for orienting a disc having a flat protion by rotating the disc. U.S. Application Ser. No. 970,146, abandoned in favor of Application Ser. No. 256,173, covers a device in which said two devices are combined so that rough position adjustment and fine position adjustment of a disc are effected in two stages. However, the device of this copending application effects the rough position adjustment and the fine position adjustment in different stages.

The present invention relates to a device for effecting the rough position adjustment and the fine position adjustment in one and the same stage.

However, the device for effecting the rough position adjustment and the fine position adjustment in one and the same stage is known per se. Since such device has a deep relation with the device of the present invention and applicant does not have the publication which describes such device, it will be described by reference to FIGS. 1 and 2 of the accompanying drawings. In these Figures, reference numeral 1 designates a wafer. This wafer is carried onto an orienting base plate 2 by wafer conveying means, not shown. The wafer thus conveyed faces in any direction as indicated by 1'. Air supplied from an air supply port 7 is blown off toward the surface of the base plate 2 through a plurality of inclined holes 8 to float up the wafer 1' and urge the wafer 1' in the direction of arrow. Accordingly, the wafer 1' has a portion of its periphery brought into contact with a driven roller 4 and a drive roller 3 and starts to rotate with the rotation of the drive roller 3.

Finally, the wafer 1' completes its orientation by a point on the circular circumferential portion thereof contacting the driven roller 4, a point on the straight portion thereof contacting the drive roller 3 and the intersection between the circular circumferential portion and the straight portion contacting a fixed block 5. That is, when the wafer has been rotated to this position, the drive of the drive roller 3 is stopped by a photoelectric switch 9 to stop the rotation of the wafer. By this stoppage, the rough position adjustment of the wafer is accomplished. At the same time, the fine position adjustment of the water 1 is effected since the wafer is urged against the driven (rotating) roller 4 and the drive roller 3 by the air from the air supply port 7. However, where the wafer is in the state as indicated by 10 at the point of time whereat the drive roller 3 has been stopped, a reaction force for the water urging force by the air is produced at the points of contact between the driven roller 4 and the drive roller 3 and the wafer and when an attempt is made to rotate the wafer to its final position, a torque is produced. On the other hand, a friction force resulting from such reaction force acts in a direction to block the rotation of the wafer. The drive roller 3 is directly connected to a drive source (a motor or the like) and therefore, its rotational torque is great and thus, sliding friction acts at the point of contact between the drive roller 3 and the wafer and the rotation blocking torque often becomes greater than the rotational torque and thus, the wafer completes its orientation in the state as indicated by 10, which has been a factor for aggravating the accuracy of orientation.

The same thing may also occur when the drive roller 3 is stopped with the wafer being in the state as indicated by 10'.

SUMMARY OF THE INVENTION

The present invention has been made in view of the above-noted point and an object thereof is to provide a disc orienting device having good accuracy of orientation. For this purpose, the drive roller of the disc orienting device of the present invention operates as a driven (rotating) roller of small rotational torque at the stage whereat the rotative driving of the disc has been terminated.

The invention will become fully apparent from the following detailed description thereof taken in conjunction with the accompanying drawings.

DESCRIPTION OF THE PREFERRED EMBODIMENTS

The wafer orienting device of the present invention will hereinafter be described with reference to FIGS. 3A, B and C.

Figure 1A:
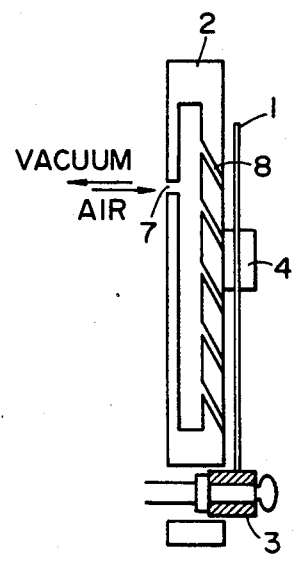
FIGS. 1A and B and FIG. 2 illustrate the wafer orienting device according to the prior art.
Figure 1B:
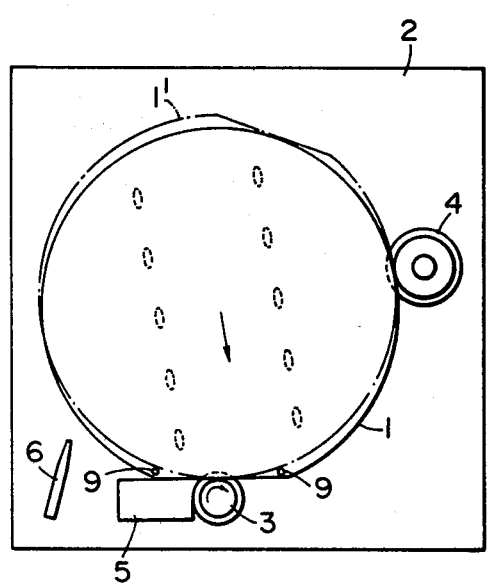
Figure 2:
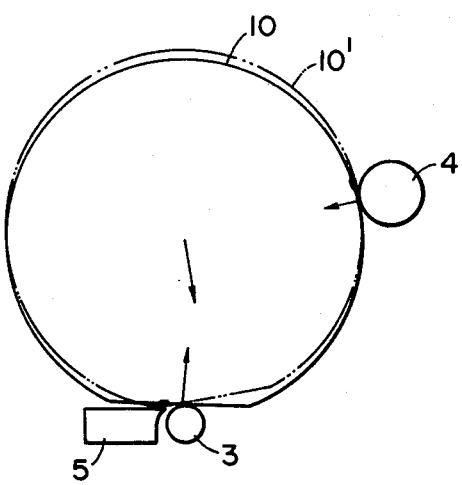
Figures 3A, 3B, 3C:
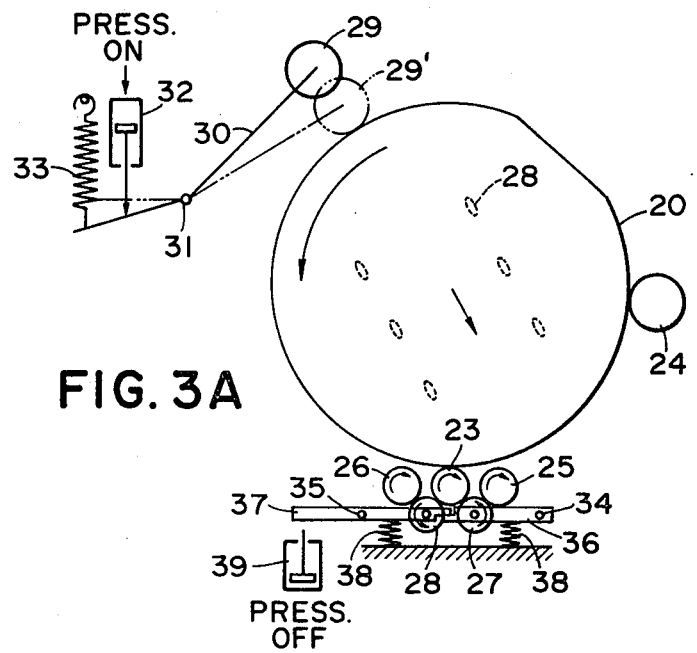
FIGS. 3A, B and C schematically illustrate the wafer orienting device of the present invention.

In FIG. 3A, a wafer 20 placed in any direction is floated up by the air jet from air holes 28 formed in the back side thereof as in the system of the prior art, and has the peripheral portion thereof brought into contact with a driven roller 24 and a drive roller 23 by a pressure force resulting from inclining the base plate or the holes 28, and is counterclockwisely rotated with the rotation of the drive roller 23.

At this time, an urging roller 29 held by a lever 30 having a rotary shaft 31 escapes from the peripheral portion of the wafer by a pressure being supplied to a cylinder 32, but it may be arbitrarily effected to release the pressure of the cylinder 32 to cause the roller 29 to bear against the peripheral portion of the wafer (the state as indicated at 29') and thereby apply a pressure force.

Orienting rollers 25 and 26 are disposed at the opposite sides of the drive roller 23, and idler rollers 27 and 28 are disposed in such a manner that they are in contact with the drive roller 23 and the orienting rollers 25, 26.

The idler rollers 27 and 28 are respectively held by arms 36 and 37 having their respective centers of rotation 34 and 35 and are urged toward the drive roller 23 and the orienting rollers 25, 26 by springs, so that the rotation of the drive roller 23 is transmitted to the orienting rollers 25 and 26.

Accordingly, it will be understood that in whatever direction the wafer 20 may be, the peripheral portion of the wafer is in contact with any one of the rollers 23, 25 and 26 (which has a driving force) and thus, there is not the dead point which has existed in the prior art system having a single drive roller.

In the above-described construction, the orienting rollers 24, 25, 26 and the urging roller 29 include mechanical elements having a light rotational torque such as, for example, antifriction ball bearings.

When the wafer rotated as described above has come near a predetermined oriented position, it is detected by photoelectric detector means 40. At this time, a pressure is supplied to a cylinder 39, which thus moves levers 36 and 37 to bring the idler rollers 27 and 28 out of contact with the drive roller 23 and the orienting rollers 25, 26. As a result, the orienting rollers 25, 26 are separated from a drive source and thus become single rollers rotatable at a low torque.

As shown in FIG. 3C, the drive roller 23 is disposed so as to be retracted by a minute amount Δ from the tangential line of the orienting rollers 25, 26.

Accordingly, the final oriented position of the wafer is determined in such a form that, as shown in FIG. 3B, for a pressure force in the direction of arrow, a point on the circular circumference thereof is in contact with the orienting roller 24 and the wafer is in contact with the orienting rollers 25, 26 at two points on the straight circumferential portion thereof.

This state is a statically stable system if the rollers 24, 25 and 26 are low torque rotatable members such as usual antifriction ball bearings, and the wafer will be located at its final position by the pressure force even if any one of these rollers is spaced apart from the periphery of the wafer. The adsorption of the wafer in its final oriented position is accomplished by supplying vacuum to the air holes 28.

In FIG. 3B, the urging roller 29 is utilized as the means for preventing the wafer from being separated from the orienting rollers during the final adsorption. At a point of time whereat the wafer has come into the stable system, the pressure supplied to the cylinder 32 is relieved and the urging roller 29 urges the wafer 20 in the direction of arrow with the aid of the force of a spring 33 through the lever 30.

In this state, vacuum is supplied through the air holes 28 to adsorb the wafer and complete the orientation thereof. Desirably, the urging roller 29 may also be a low torque rotatable member.

Utilizing the urging roller 29 as the means for preventing the wafer from being separated from the reference (orienting) rollers during the adsorption is not always a requisite condition, but depending on the situation in which the device is used, use may be made of any means which will provide a necessary pressure force and which will not destroy the stable system. For example, utilization of the gravity resulting from an inclination, blowing air against the surface of the wafer, etc, would occur to mind.

Figure 4A:
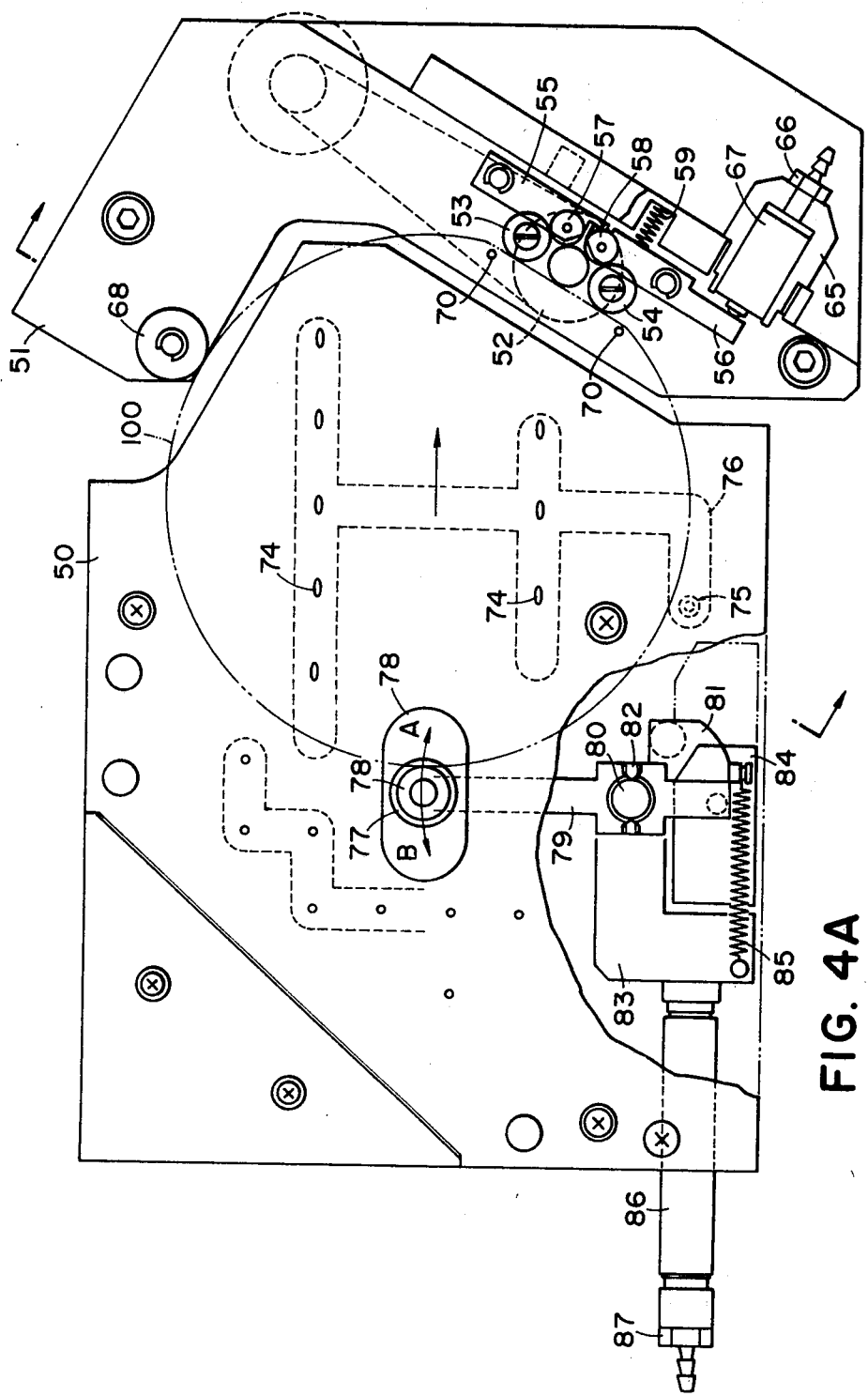
FIGS. 4A and B illustrate an embodiment of the wafer orienting device according to the present invention.

A more detailed embodiment is shown in FIG. 4A. In this embodiment, the device is divided into a base plate 50 adjacent to the air bearing and urging roller and a base plate 51 adjacent to the rollers, and these two base plates are adjusted into a predetermined positional relation and then fixed onto the same structure.

On the base plate 51 adjacent to the rollers, a drive roller 52 is disposed and orienting rollers 53 and 54 are disposed at the opposite sides of the drive roller, and idler rollers 57 and 58 held by arms 55 and 56 are urged against the drive roller 52 and the orienting rollers 53, 54 by a spring 59.

A pulley 61 is mounted on the other end of the drive roller 52 held by a bearing housing 60, and the rotation of a motor 62 is transmitted to the drive roller 52 through a belt 64 passed over and between the pulley 61 and a motor pulley 63.

By supplying an air pressure into a cylinder 65 through a tube coupling 66, a piston 67 is forced out to operate the arms 55 and 56 and cause the idler rollers 57 and 58 to escape, whereby the orienting rollers may become rotatable rollers.

In this embodiment, the orienting rollers 53 and 54 use signal antifriction ball bearings. Another orienting roller 68, as shown in the cross-sectional view of FIG. 4B, uses an antifriction ball bearing 69 therewithin, thereby reducing the rotational torque.

Figure 4B:
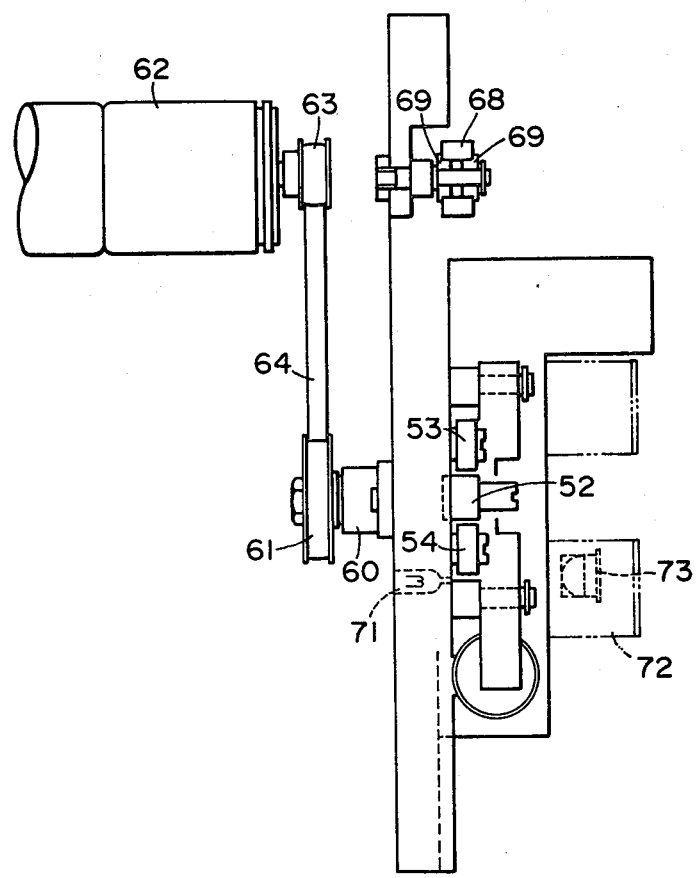

Photoelectric sensors for detecting the arrival of the wafer at a predetermined position are provided at two locations indicated by 70 specifically, as shown in the cross-sectional view of FIG. 4B, each of these photoelectric sensors is constructed so that the light of a lamp 71 incorporated in the base plate 51 is received by a light receptor 73 contained in a light receptor holder 72 above the roller.

The base plate 50 is formed with a plurality of oblique blow-off holes 74. When an air pressure is supplied through the tube coupling, air is blown off from each hole 74 through a manifold 76 formed in the interior of the base plate 50 and acts on the back side of a wafer (100) to float up the wafer and urge the wafer in the direction of arrow.

The tube coupling 75, manifold 76 and oblique holes 74 are also used to adsorb and fix the wafer onto the base plate 50 by supplying vacuum to these. A unit for driving the urging roller is mounted on the base plate 50. The urging roller 77 acts on the wafer through a cut-away portion 78 formed in the base plate 50. The urging roller 77 also has on antifriction ball bearing 78 therewithin, thereby reducing the rotational torque. A lever 79 holding the urging roller 77 has a tilting function about a shaft 82 with respect to a flange 81. The flange 81 has the function of rotating about a shaft 80 formed within a block 83. Thus, the lever 79 has the rotating and tilting functions with respect to the base plate 50.

The rotation and tilting of the lever 79 are effected at a time by releasing the supply of air pressure through a tube coupling 87 to thereby operate a cylinder 86 and cause a straight cam 84 to go in and out.

When an air pressure has been supplied into the cylinder 86 through the tube coupling 87, the straight cam 84 is forced out, as a result of which the urging roller 77 moves in the direction of arrow $B_1$ and then moves down and escapes from the surface of the base plate 50.

Conversely, when the pressure in the cylinder 86 has been eliminated, the straight cam is forced in, as a result of which the urging roller 77 moves upwardly to come out of the surface of the base plate 50, whereafter it rotates in the direction of arrow A. Even after the urging roller 77 has been stopped by striking against the wafer 100, the straight cam 84 is still forced in to lose its effect and instead, the force of a spring 85 comes to act as the wafer urging force.

The wafer 100 in FIG. 4A shows the final oriented position thereof.

What I claim is:

1. A device for orienting a disc having a flat portion formed on the outer periphery thereof, comprising:
   a base plate on which a disc may be disposed;
   at least one positioning means for point-contacting the outer periphery of said disc disposed on said base plate;
   rotary drive means;
   a first rotatable roller for point-contacting the outer periphery of said disc and coupled to said drive means for imparting a rotational force to said disc;
   second and third rotatable rollers disposed on opposite sides of said first rotatable roller for point-contacting the outer periphery of said disc and being coupleable to said drive means for imparting a rotational force to said disc, the periphery of said first roller being spaced, in a direction away from said disc, from a common tangent to the peripheries of said second and third rollers that lies adjacent the periphery of said disc, so that said first roller does not contact the flat portion of said disc when said second and third rollers contact the flat portion;
   clutch means for interrupting the coupling of said second and said third rotatable rollers to said drive means when said disc has come to a predetermined rotational position; and
   resiliently urged roller means for engaging said disc for moving it toward said positioning means and said first roller when the coupling of said second and said third rollers to said drive means is interrupted by said clutch means.

2. A device for orienting a disc having a flat portion formed on the outer periphery thereof, comprising:
   a base plate on which a disc may be disposed;
   at least one positioning means for point-contacting the outer periphery of said disc disposed on said base plate;
   rotary drive means;
   a first rotatable roller for point-contacting the outer periphery of said disc and coupled to said drive means for imparting a rotational force to said disc;
   second and third rotatable rollers disposed on opposite sides of said first rotatable roller and rotatable in the same direction as said first rotatable roller, for point-contacting the outer periphery of said disc and being coupleable to said drive means for imparting a rotational force to said disc, the periphery of said first roller being spaced, in a direction away from said disc, from a common tangent to the peripheries of said second and third rollers that lies adjacent the periphery of said disc, so that said first roller does not contact the flat portion of said disc when said second and third rollers contact the flat portion;
   clutch means for interrupting only the coupling of said second and said third rotatable rollers to said drive means when said disc has come to a predetermined rotational position; and
   means for urging said disc toward said positioning means and said first roller when the coupling of said second and said third rollers to said drive means is interrupted by said clutch means.

* * * * *